United States Patent
Son et al.

(10) Patent No.: US 10,028,222 B2
(45) Date of Patent: Jul. 17, 2018

(54) APPARATUS AND METHOD FOR CONTROLLING POWER IN A COMMUNICATION SYSTEM

(71) Applicant: Samsung Electronics Co., Ltd., Suwon-si (KR)

(72) Inventors: Ju-Ho Son, Seoul (KR); Jeong-Ho Lee, Suwon-si (KR); Chul-Woo Byeon, Suwon-si (KR); Dae-Young Lee, Seongnam-si (KR); Sun-Kyu Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 219 days.

(21) Appl. No.: 14/986,069

(22) Filed: Dec. 31, 2015

(65) Prior Publication Data
US 2016/0192295 A1 Jun. 30, 2016

(30) Foreign Application Priority Data

Dec. 31, 2014 (KR) .................. 10-2014-0194983
Dec. 28, 2015 (KR) .................. 10-2015-0187085

(51) Int. Cl.
*H04W 52/02* (2009.01)
*H03F 1/02* (2006.01)
(Continued)

(52) U.S. Cl.
CPC ...... *H04W 52/0225* (2013.01); *H03F 1/0277* (2013.01); *H03F 3/19* (2013.01);
(Continued)

(58) Field of Classification Search
CPC .... H04W 52/0225; H04W 52/18; H04B 1/06; H04B 7/00; H04B 1/18; H04B 1/1027;
(Continued)

(56) References Cited

U.S. PATENT DOCUMENTS 6,498,926 B1 * 12/2002 Ciccarelli .............. H04B 1/109
330/129
2006/0238248 A1 10/2006 Chang
(Continued)

FOREIGN PATENT DOCUMENTS

KR 10-2010-0019010 A 2/2010

OTHER PUBLICATIONS

Int'l Search Report and Written Opinion for PCT/KR2015/014404 dated Apr. 5, 2016.

*Primary Examiner* — Thanh Le
(74) *Attorney, Agent, or Firm* — McAndrews, Held & Malloy, Ltd.

(57) ABSTRACT

An apparatus and method for controlling power in a communication system are provided. The method includes amplifying an input signal by a second processor farther from an antenna than a first processor, and determining whether to enable or disable each of the first processor and the second processor based on results from the amplification by the second processor. Another method includes amplifying an input signal from an antenna by a second processor electrically farther from the antenna than a first processor, and determining whether to operate the first processor and the second processor based on a value related to a reception state for the amplified signal by the second processor.

17 Claims, 4 Drawing Sheets

(51) Int. Cl.
*H03F 3/19* (2006.01)
*H03F 3/72* (2006.01)
*H03G 3/30* (2006.01)

(52) U.S. Cl.
CPC ............. *H03F 3/72* (2013.01); *H03G 3/3052* (2013.01); *H03G 3/3078* (2013.01); *H03F 2200/294* (2013.01); *H03F 2200/321* (2013.01); *H03F 2200/451* (2013.01); *H03F 2203/7231* (2013.01); *H03F 2203/7239* (2013.01); *Y02D 70/00* (2018.01); *Y02D 70/1262* (2018.01); *Y02D 70/142* (2018.01); *Y02D 70/21* (2018.01)

(58) Field of Classification Search
CPC ....... H04B 1/109; H03F 1/0261; H03F 1/342; H03F 3/193; H03F 2200/294; H03G 1/0088; H03G 3/3068
See application file for complete search history.

(56) References Cited

U.S. PATENT DOCUMENTS

2009/0140813 A1\* 6/2009 Kang .................. H03G 3/3068
330/278
2013/0005289 A1 1/2013 Vahidfar et al.
2013/0137386 A1 5/2013 Sivonen et al.
2014/0018026 A1 1/2014 Klepser et al.
2014/0273901 A1 9/2014 Liu et al.

\* cited by examiner

APPARATUS AND METHOD FOR CONTROLLING POWER IN A COMMUNICATION SYSTEM

RELATED APPLICATION(S)

This application claims the benefit under 35 U.S.C. § 119(a) of a Korean patent application filed in the Korean Intellectual Property Office on Dec. 31, 2014 and assigned Serial No. 10-2014-0194983 and a Korean patent application filed in the Korean Intellectual Property Office on Dec. 28, 2015 and assigned Serial No. 10-2015-0187085, the entire disclosure of which is incorporated herein by reference.

BACKGROUND

The present disclosure relates to wireless communication, and more particularly to an apparatus and method for controlling power in order to reduce power consumption when receiving wireless communication.

To meet the demand for wireless data traffic, which has increased substantially since deployment of $4^{th}$ generation (4G) communication systems, efforts have been made to develop an improved $5^{th}$ generation (5G) or pre-5G communication system. The 5G or pre-5G communication system is also called a 'beyond 4G network' or a 'post LTE system'.

The 5G communication system is considering higher frequency (mmWave) bands such as, for example, 60 GHz bands, to accomplish higher data rates. To decrease the propagation loss of radio waves and increase a transmission distance, beamforming, massive multiple-input multiple-output (MIMO), full dimensional MIMO (FD-MIMO), array antenna, analog beamforming, and large scale antenna techniques are under consideration for the 5G communication systems.

In the 5G communication systems, development for system network improvement is under way based on advanced small cells, cloud radio access networks (RANs), ultra-dense networks, device-to-device (D2D) communication, wireless backhaul, moving network, cooperative communication, coordinated multi-point (CoMP), reception-end interference cancellation, and the like.

In the 5G systems, frequency and quadrature amplitude modulation (FQAM), and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

Techniques for minimizing power consumption at a receiver have been developed in communication systems. For example, since an mmwave communication system uses a high frequency of 30 GHz or 60 GHz, a low noise amplifier (LNA) having good reception performance is used due to high voltages. Such an LNA is fabricated using a chemical compound such as, for example, Gallium Arsenide (GaAs). However, despite good reception performance relative to other types of LNAs, the LNA using this type of chemical compound consumes more power. This type of LNA will be referred to as chemical compound LNA.

Among the communication systems, a wireless local area network (WLAN) communication system is a short-range communication system and thus uses a plurality of complementary metal-oxide semiconductor (CMOS) LNAs. Although the CMOS LNAs consume lower power and are favorable for one-chip implementation, they have low reception sensitivity relative to LNAs using a chemical compound.

Reception sensitivity is particularly significant to mobile communication systems because mobile communication is not short-range communication. Thus, most of the mobile communication systems use a chemical compound LNA that requires high supply voltage. However, a high supply voltage increases power consumption in communication equipment using a battery, such as a terminal, thus imposing many constraints on use time.

The above information is presented as background information only to assist with an understanding of the present disclosure. No determination has been made, and no assertion is made, as to whether any of the above might be applicable as prior art with regard to the present disclosure.

SUMMARY

An aspect of the present disclosure is to address at least the above-mentioned problems and/or disadvantages and to provide at least the advantages described below. Accordingly, an aspect of the present disclosure is to provide an apparatus and method for controlling power using a low noise amplifier (LNA) in a communication system.

Another aspect of the present disclosure is to provide an apparatus and method for controlling power to minimize power consumption according to a distance in a communication system.

In accordance with an aspect of the present disclosure, there is provided a method for controlling power in a communication system. The method includes amplifying an input signal from an antenna by a second processor electrically farther from the antenna than a first processor, and determining whether to operate the first processor and the second processor based on a value related to a reception state for the signal amplified by the second processor.

In accordance with another aspect of the present disclosure, there is provided an apparatus for controlling power in a communication system. The apparatus includes a first processor configured to amplify an input signal from an antenna under control of a controller, where the first processor is electrically nearest to the antenna. The apparatus includes a second processor configured to amplify the inputted signal from the antenna or the amplified signal by the first processor under control of the controller, where the second processor is electrically farther from the antenna than a first processor. The controller determines whether to operate the first processor and the second processor based on a value related to a reception state for the amplified signal by the second processor.

In accordance with an aspect of the present disclosure, there is provided a method for controlling power in a communication system. The method includes amplifying a signal from an antenna by a second processor electrically farther from the antenna than a first processor The method further includes determining by a controller whether to enable or disable amplifying by each of the first processor and the second processor based on a value related to a reception state for the signal amplified by the second processor with respect to a first threshold, a second threshold, and a third threshold.

In accordance with another aspect of the present disclosure, there is provided an apparatus for controlling power in a communication system. The apparatus includes a second processor configured to amplify a signal from an antenna, wherein the second processor is electrically farther from the antenna than a first processor. The apparatus further includes a controller configured to determine whether to enable or disable amplifying by each of the first processor and the second processor based on a value related to a reception state for the signal amplified by the second processor with respect to a first threshold, a second threshold, and a third threshold.

The first threshold may be larger than the third threshold and smaller than the second threshold. The controller may determine to enable amplifying by the second processor and disable amplifying by the first processor if the value related to the reception state is larger than the first threshold. The controller may also determine to disable amplifying by the first processor and the second processor if the value related to the reception state is larger than the second threshold.

The controller may further determine to enable amplifying by the first processor and disable amplifying by the second processor if the value related to the reception state is smaller than the first threshold. The controller also may determine to enable amplifying by the first processor and the second processor if the value related to the reception state is smaller than the third threshold The first processor may include a chemical compound low noise amplifier, where the chemical compound is gallium arsenide. The second processor may include a complementary metal-oxide semiconductor (CMOS) low noise amplifier. A first switch may communicate the signal from the antenna to one of an input to a first low noise amplifier or to an input of a second switch, and the second switch may communicate the signal from the first switch to one of an input to a second low noise amplifier or as an output of the second processor.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

The above and other aspects, features and advantages of certain exemplary embodiments of the present disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
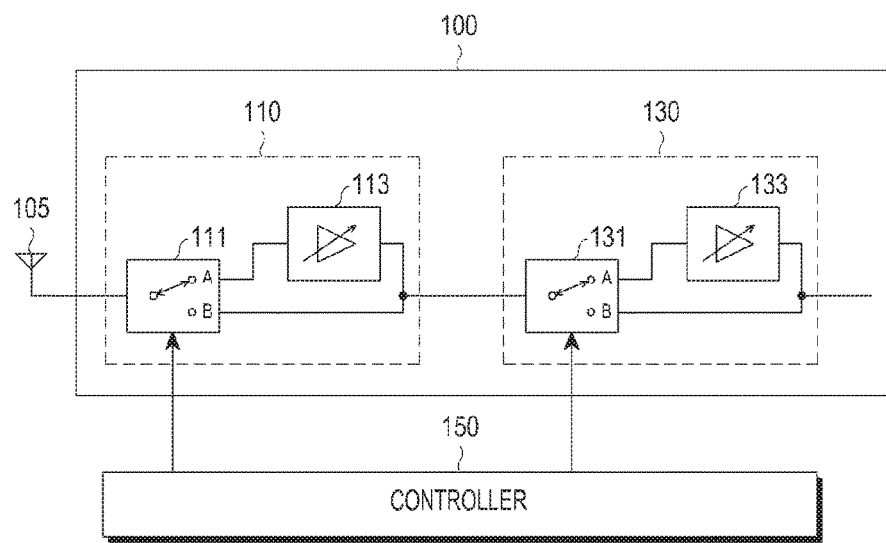
FIG. 1 illustrates an exemplary power control apparatus according to an embodiment of the present disclosure.

Various embodiments of the present disclosure are described with reference to the accompanying drawings. These embodiments of the present disclosure can be subject to various modifications and implemented. Specific embodiments are illustrated in the drawings and described in detail. However, the scope of the present disclosure is not intended to be limited to these particular embodiments and it is to be understood that the present disclosure covers all modifications, equivalents, and/or alternatives falling within the scope and spirit of the present disclosure. In relation to a description of the drawings, like reference numerals denote the same components.

In the present disclosure, the term "have," "may have," include," or "may include" signifies the presence of a specific function, operation, or component, not excluding the presence of one or more additional functions, operations, or components. Also, in various embodiments of the present disclosure, the term "have," "may have," "include," or "may include" signifies the presence of a specific feature, number, step, operation, component, or part, or their combination, not excluding the presence or addition of one or more other features, numbers, steps, operations, components, or parts, or a combination thereof.

In the present disclosure, the term "or" may cover all possible combinations of enumerated words. For example, A or B" may represent inclusion of A, inclusion of B, or inclusion of both A and B.

The term as used in various embodiments of the present disclosure, "first" or "second" may modify various components in various embodiments, not limiting the components. Accordingly, the expressions do not limit the sequence and/or importance of the components. These expressions may be used to distinguish one component from another component. For example, a first user equipment (UE) and a second UE may refer to two physically separate UEs. Therefore, a first component may be referred to as a second component and vice versa without departing from the scope of the present disclosure.

When it is said that a first component is "operatively or communicatively coupled with/to" or "connected to" a second component, it should be understood that the first component may be connected to the second component directly or through another component. On the other hand, when it is said that a first component is "directly connected to" or "directly coupled to" a second component, it should be understood that there is no other component between the first and second components.

The terms as used in the present disclosure are provided to merely describe specific embodiments, and are not intended to limit the scope of any embodiment. It is to be understood that singular forms include plural referents unless the context clearly dictates otherwise.

Unless otherwise defined, the terms and words including technical or scientific terms used in the following description and claims may have the same meanings as generally understood by those skilled in the art. The terms as generally defined in dictionaries may be interpreted as having the same or similar meanings as or to contextual meanings of related technology.

The present disclosure is intended to operate an amplifier that minimizes power consumption, while maintaining a constant state that enables reception according to a distance between a transmitter and a receiver as a reception state, from among a plurality of amplifiers in a communication system.

For this purpose, an apparatus and method for controlling power according to an embodiment of the present disclosure will be described below in detail.

FIG. 1 illustrates an exemplary power control apparatus according to an embodiment of the present disclosure.

Referring to FIG. 1, the power control apparatus includes a processing unit 100 and a controller 150. The processing unit 100 includes a first processor 110 and a second processor 130.

The first processor 110 includes a first switch 111 and a first low noise amplifier (LNA) 113. The first switch 111 sends signals received by the antenna 105 to either the first LNA 113 via the output A or the second processor 130 via the output B under the control of the controller 150. The first LNA 113 is a chemical compound LNA chip having a small noise figure (NF) and relatively large power consumption. An NF is defined as the ratio of the signal to noise ratio (SNR) of a signal at an input end to the SNR of a signal at an output end, expressed in dB.

The second processor 130 includes a second switch 131 and a second LNA 133. The second switch 131 sends signals received from the first processor 110 to either the second LNA 133 via output A or as an output of the second processor 130 via output B under the control of the controller 150. The second LNA 133 is a CMOS LNA having a large NF and relatively small power consumption.

The first processor 110 may be closer to the antenna 105 since it is needed to amplify weaker signals that the second processor 130. Accordingly, placing the first processor 110 closer to the antenna 105 may allow signals from the antenna 105 to reach the first LNA 113 with less degradation than if it was placed farther away with the second switch 131 also in its path. The LNA 113 may be said to be electrically closer to the antenna 105 than the LNA 133, and the LNA 133 may be said to be electrically farther from the antenna 105 than the LNA 113.

The controller 150 operates each of the first and second processors 110 and 130, and checks a reception state according to the operation of each processor. This will be explained in more detail with respect to FIG. 2. The controller 150 determines whether to operate the first and second processors 110 and 130 at a digital part decision time according to a value related to a reception state based on the operation of the second processor 130. The digital part decision time determination may occur periodically or in an event-triggered manner. For example, if the terminal uses semi-persistent scheduling (SPS) as is used for voice call, a digital part decision may be made periodically, whereas if the terminal requests a data service, the digital part decision may be made in an event-triggered manner.

Figure 2:
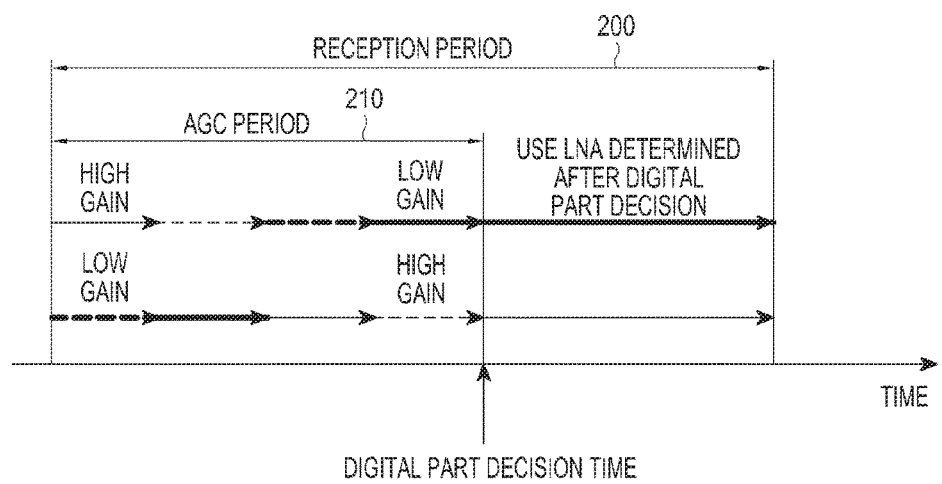
FIG. 2 illustrates an exemplary operation of a controller for determining whether to operate a first processor and a second processor in the power control apparatus according to an embodiment of the present disclosure.

Specifically, the controller 150 may operate each of the first and second processors 110 and 130, and determine whether to operate the first and second processors 110 and 130 at a digital part decision time according to a value related to a reception state based on the operation of the second processor 130, as illustrated in FIG. 2. Since there are the first and second switches 111 and 131 in the first and second processor 110 and 130, respectively, the controller 150 can select one of 4 combinations for using the first and second LNAs 113 and 133. With respect to the signal from the antenna 105: 1) minimum gain—bypass both the first LNA 113 and the second LNA 133; 2) low gain—bypass the first LNA 113, amplified by the second LNA 133; 3) high gain—amplified by the first LNA 113, bypass the second LNA 133; and 4) maximum gain—amplified by both the first LNA 113 and the second LNA 133.

FIG. 2 illustrates an example in which the controller 150 determines whether to operate the first and second processors 110 and 130 in the power control apparatus according to an embodiment of the present disclosure.

Referring to FIG. 2, the controller 150 determines whether to operate the first and second processors 110 and 130 during a reception period 200 and controls operation of the first and second processors 110 and 130. The reception period 200 includes a variable automatic gain control (AGC) period 210 for determination of a digital part decision time. An initial gain may be set to minimize the AGC period 210 in consideration of a predictable or measurable reception power, an interference level, a link state, or a required data rate. A gain value may be increased or decreased during the AGC period 210 depending on the initial gain. The initial gain may be set to high gain based on an assumption that the received power is low, or the initial gain may be set to low gain based on an assumption that the received power is high. The assumption may be based, for example, on a previous gain setting.

If the initial gain was set to high gain, the controller 150 may decrease a gain value from high gain to low gain during the AGC period 210. For this purpose, the controller 150 may switch the first LNA 113 from an ON state to an OFF state by controlling the first switch 111. The controller 150 may also increase the gain value from low gain to high gain. For this purpose, the controller 150 may switch the first LNA 113 from the OFF state to the ON state by controlling the first switch 111.

To minimize reception level discontinuity or link instability caused by turning the first LNA 113 ON or OFF, a previous operation state of the first LNA 113 may be considered.

Now, a description will be given of an operation for determining a processor to be used for reception signal detection at a digital part decision time (i.e., an ending time of the AGC period 210), for example, based on reception power. An operation for determining a processor based on a reception level, an interference level, a link state, or a data rate, instead of reception power, may be performed similarly to the operation for determining a processor based on reception power.

For example, the controller 150 may operate the second processor 130 during the AGC period 210 by controlling the first and second switches 111 and 131 so that the first LNA 113 is OFF and the second LNA 133 is ON. This may be referred to as the second reception state. Then, the controller 150 checks a power output value related to the amplified signal output by the processing unit 100 in the second reception state. The controller 150 may then operate the first processor 110 by controlling the first and second switches 111 and 131 so that the first LNA 113 is ON and the second LNA 133 is OFF. This may be referred to as the first reception state. Then, the controller 150 checks a power output value related to the amplified signal output by the processing unit 100 in the first reception state.

The controller 150 controls the first and second switches 111 and 131 based on the value related to the second reception state at the digital part decision time (i.e., the ending time of the AGC period 210). The value related to the second reception state may be compared to a first threshold, which may be predetermined, to minimize power consumption during signal reception. The controller 150 determines whether the value related to the second reception state is larger than the first threshold even though the first processor 110 is inoperative. Depending on how much larger the value related to the second reception state is than the first threshold, the controller 150 may determine to operate only the second processor 130 or neither of the first and second processors 110 and 130. If the value related to the second reception state is larger than a second threshold, which is larger than the first threshold, this may indicate that the signal received is strong enough that it need not be amplified. Accordingly, the controller 150 does not operate either of the first and second processors 110 and 130.

On the other hand, if the value related to the second reception state is smaller than the first threshold, the controller 150 may determine to operate only the second processor 130, or both of the first and second processors 110 and 130 if the signal is sufficiently weak. For example, if the value related to the second reception state is smaller than a third threshold, which is smaller than the first threshold, the controller 150 may operate both of the first and second processors 110 and 130. The case where the value related to the second reception state is equal to the first threshold may be design and/or implementation dependent. For example, the controller 150 may determine whether to operate the first processor 110 or the second processor 130 depending on a system setting.

Consequently, if a reception distance is larger than a predetermined threshold, the controller 150 may control the first processor 110 to operate, and if the reception distance is smaller than the predetermined threshold, the controller 150 may control the second processor 130 to operate, in order to consume minimum power according to a reception distance. It is assumed that strong signals are transmitted from close by and weak signals are transmitted from farther away. If maximum amplification is required, the controller 150 may control both of the first and second processors 110 and 130 to operate, and if minimum amplification is required, the controller 150 may control the first and second processors 110 and 130 to not operate.

Power consumption by the first and second processors 110 and 130 will be described with respect to FIG. 3.

Figure 3:
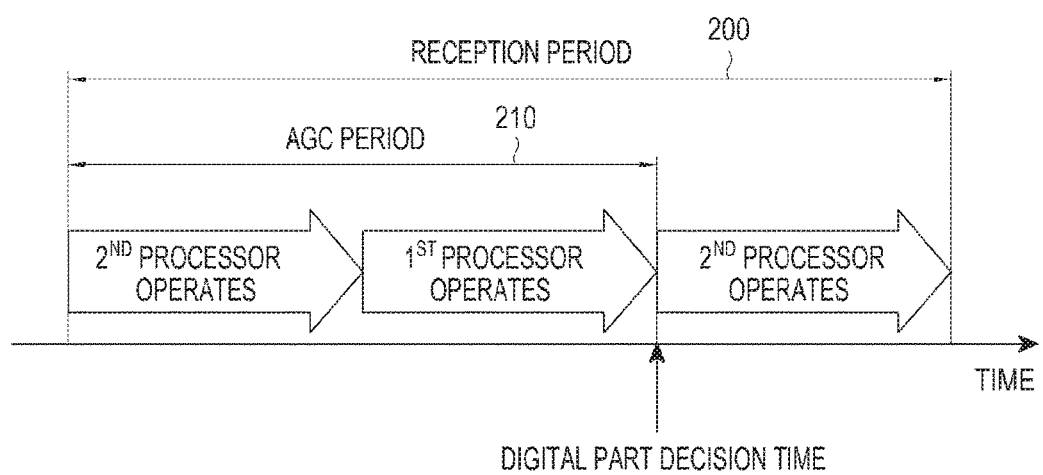
FIG. 3 illustrates an exemplary operation of the controller in the power control apparatus according to an embodiment of the present disclosure.

FIG. 3 illustrates an exemplary operation of the controller 150 in the power control apparatus according to an embodiment of the present disclosure.

It is assumed that the first LNA 113 is a GaAs LNA and has an NF of 2 dB and a gain of 20 dB, and the second LNA 133 is a CMOS LNA and has an NF of 3.5 dB and a gain of 20 dB according to an embodiment of the present disclosure. It is also assumed that a power loss of 1 dB occurs from the antenna 105 to the first switch 111, a power loss of 1 dB occurs from the second LNA 133 to the next connected block, and a maximum loss of a printed circuit board (PCB) is 8.6 dB.

In the power control apparatus configured in the above-described environment, in a first operation, the controller 150 may set the first switch 111 to bypass the first LNA 113 and set the second switch 131 to the input of the second LNA 133. Accordingly, only the second processor 130 will amplify during a first portion of the AGC period 210 in the reception period 200. When the second processor 130 operates, the controller 150 may determine that a system NF is 13.1 dB and power consumption is 240 mW.

In a second operation, the controller 150 may set the first switch 111 to the input of the first LNA 113 and set the second switch 131 to bypass the second LNA 133. Accordingly, only the first processor 110 may amplify during the second portion of the AGC period 210 in the reception period 200. When the first processor 110 operates, the controller 150 may determine that the system NF is 2.217 dB and power consumption is 1120 mW.

Accordingly, it may be observed that when only the second processor 130 is amplifying, 910 mW less power is used compared to only the first processor 110 operating. Or, the first processor 110 requires 5.3 times as much power to operate as the second processor 130. Therefore, if the value related to the second reception state is larger than the predetermined first threshold at the digital part decision time (i.e., the ending time of the AGC period 210), the controller 150 may operate only the second processor 130 without operating the first processor 110 to save significant amount of power.

The configuration and operation of the power control apparatus according to an embodiment of the present disclosure have been described above. Now, a description will be given of a method for controlling power in the power control apparatus.

Figure 4:
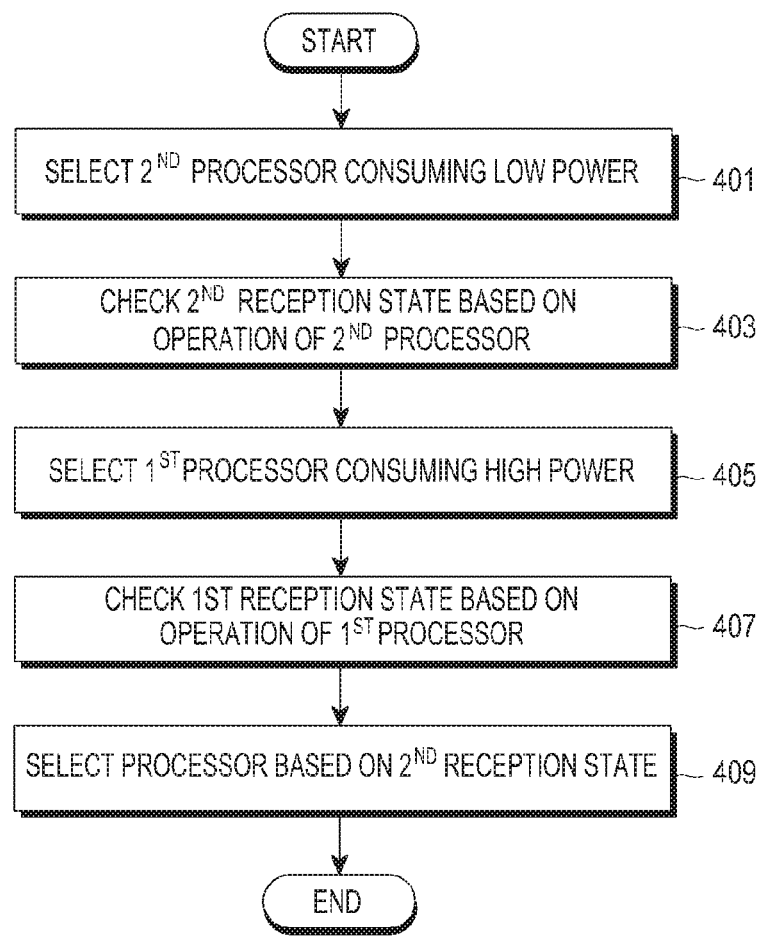
FIG. 4 is a flowchart illustrating a power control method according to an embodiment of the present disclosure.

FIG. 4 is a flowchart illustrating a method for controlling power in the power control apparatus according to an embodiment of the present disclosure.

Referring to FIG. 4, when the controller 150 initially operates during the AGC period 210 included in the reception period 200, the controller 150 selects for operation just the second processor 130 consuming low power by controlling the first switch 111 and the second switch 131 in operation 401. The controller 150 checks a value related to the second reception state for the case where the second processor 130 operates in operation 403.

Then, the controller 150 selects the first processor 110 consuming high power by controlling the first switch 111 and the second switch 131 in operation 405. The controller 150 checks a value related to the first reception state for the case where the first processor 110 operates in operation 407. If the value related to the second reception state checked in operation 403 is larger than a specific range of a predetermined threshold, the controller 150 may not perform operations 405 and 407.

The controller 150 determines whether to operate the first and second processors 110 and 130 based on the value related to the second reception state in operation 409. That is, if the value related to the second reception state is larger than the predetermined first threshold, the controller 150 determines to operate the second processor 130. On the other hand, if the value related to the second reception state is smaller than the predetermined first threshold, the controller 150 determines to operate the first processor 110. In addition, if the value related to the second reception state is larger than the predetermined second threshold, the controller 150 does not enable operation of either of the first and second processors 110 and 130. Or if the value related to the second reception state is smaller than a predetermined third threshold, the controller 150 enables operation of both of the first and second processors 110 and 130.

Therefore, the controller 150 may determine whether an LNA operates according to the second reception state of the second processor 130. As a consequence, the power control apparatus according to an embodiment of the present disclosure may reduce power consumption while maintaining good reception even as received signal power fluctuates.

While the above power control method has been described in the context of receiving a signal through a single antenna in a communication system with reference to FIGS. 1 to 4, the controller 150 may also control power when a signal is received through a plurality of antennas.

Figure 5:
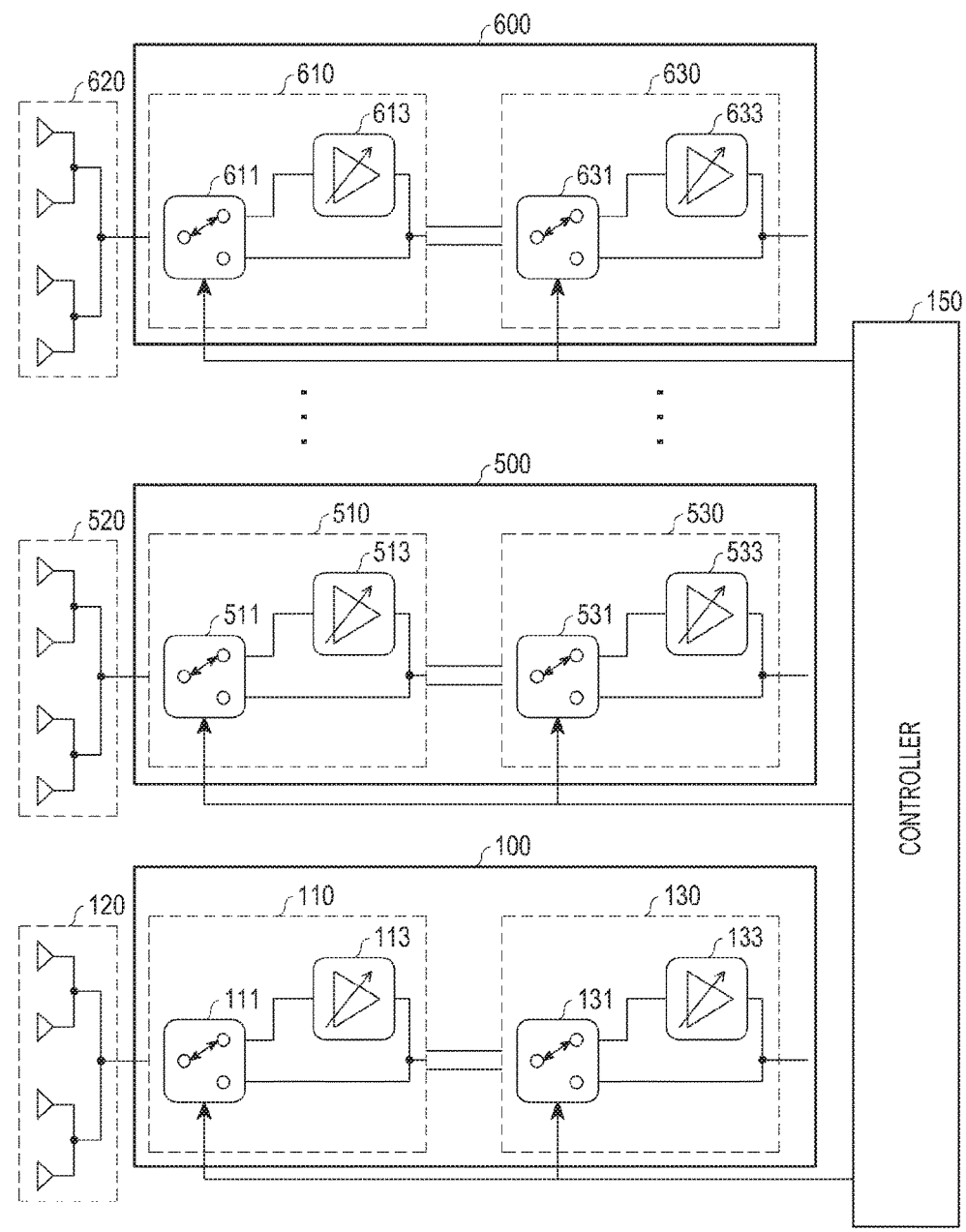
FIG. 5 illustrates another exemplary power control apparatus according to an embodiment of the present disclosure.

FIG. 5 illustrates another exemplary power control apparatus according to an embodiment of the present disclosure. While there are only 12 antennas shown in FIG. 5 by way of example, various embodiment of the present disclosure are also applicable to any communication system with any number of antennas.

Referring to FIG. 5, each of the processing unit 100 related to the array antenna 120, the processing unit 500 related to the array antenna 520, and the processing unit 600 related to the array antenna 620 includes the same components as those of the processing unit 100 illustrated in FIG.

1. Accordingly, the controller 150 may control power of each processing unit in the same power control method as described before with reference to FIGS. 1 to 4. Since how the controller 150 controls power of each processing unit has been described before with reference to FIGS. 1 to 4, the power control method will not be described below in detail to avoid redundancy. Instead, the internal structure of the power control apparatus having a plurality of array antennas will be described in great detail.

The array antenna 120 is connected to the first switch 111 of the first processor 110, the array antenna 520 is connected to a first switch 511 of a first processor 510, and the array antenna 620 is connected to a first switch 611 of the processor 610. For example, three array antennas 120, 520, 620 each including 4 antennas are connected to the first processors 110, 510, and the processor 610, respectively. However, an embodiment of the present disclosure is not limited to configuration of 3 array antennas with a total of 12 antennas. For example, 8 array antennas may be configured with 16 antennas, with each array antenna including 2 antennas, and connected to 8 first processors, and every two of the first processors may be connected in combination to a second processor. Also, 4 array antennas may be configured with a total of 16 antennas, each array antenna including 4 antennas, and connected to the four first processors, and every two of the first processors may be connected in combination to one of the second processors or the single second processor.

In addition to the first processors and the second processors, the power control apparatus may further include third processors (not shown). For example, first to eighth array antennas each having two antennas may be connected to the first processors, respectively, every two of the first processors may be connected in combination to a second processor, and every two or four of the second processors may be connected in combination to a third processor. According to the present disclosure, a plurality of antennas and a plurality of processors may be configured in many other manners. Further, the configuration of the plurality of antennas and the plurality of processors may be modified in various manners according to a control signal from the controller 150. For example, if first LNAs of the first processors are turned off, second LNAs and third LNAs of the second processors and the third processors may play the same roles as the first LNAs and the second LNAs of the first processors and the second processors.

Returning to an embodiment shown in FIG. 5, the first LNAs 113, 513, . . . , 613 may be GaAS LNAs or CMOS LNAs. The first LNAs 113, 513, . . . , 613 may be configured as CMOS LNAs according to a required reception power, an interference level, a link state, or a required data rate. Or the first LNAs 113, 513, . . . , 613 may be configured as GaAS LNAs, and the second LNAs 133, 533, . . . , 633 may be configured as CMOS LNAs.

Power control of the controller 150 in the power control apparatus having a plurality of processing units illustrated in FIG. 5 includes the case where when the first LNA 113 is on, one of the other first LNAs 513, . . . , 613 is off, as well as the case where when the first LNA 113 is on, the other first LNAs 513, . . . , 613 are also off in the plurality of the first processors 110, 510, . . . , 610. For example, when the plurality of processing units form beams, all of the first LNAs 113, 513, . . . , 613 are preferably on or off in order to achieve uniform signal characteristics between radio frequency (RF) paths. However, if each of the processing units operates in multiple input multiple output (MIMO), its operation state may be different depending on a required reception power, an interference level, a link state, or a required data rate of the path.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed is:

1. A method for controlling power in a communication system, the method comprising:
    amplifying an inputted signal from an antenna by a first processor;
    amplifying the inputted signal from the antenna by a second processor electrically farther from the antenna than the first processor; and
    determining whether to operate the first processor and the second processor based on a value related to a reception state for the amplified signal by the second processor,
    wherein the second processor is determined to be operated when the value related to the reception state is larger than a predetermined first threshold.

2. The method of claim 1, wherein the determination comprises, when the value related to the reception state is larger than a predetermined first threshold, determining to operate the second processor.

3. The method of claim 1, wherein the determination further comprises, when the value related to the reception state is smaller than the first threshold, determining to operate the first processor.

4. The method of claim 1, wherein the determination further comprises, when the value related to the reception state is larger than a predetermined second threshold, determining to operate none of the first and second processors.

5. The method of claim 4, wherein the determination further comprises, when the value related to the reception state is smaller than a predetermined third threshold, determining to operate both of the first and second processors.

6. The method of claim 5, wherein the first threshold is smaller than the second threshold and larger than the third threshold.

7. The method of claim 1, wherein the first processor includes a low noise amplifier (LNA) using a chemical compound.

8. The method of claim 1, wherein the second processor is a complementary metal-oxide semiconductor (CMOS) LNA.

9. An apparatus for controlling power in a communication system, the apparatus comprising:
    a first processor configured to amplify an inputted signal from an antenna under control of a controller, wherein the first processor is electrically nearest to the antenna;
    a second processor configured to amplify the inputted signal from the antenna or the amplified signal by the first processor under control of the controller, wherein the second processor is electrically farther from the antenna than the first processor; and
    the controller for determining whether to operate the first processor and the second processor based on a value related to a reception state for the amplified signal by the second processor,
    wherein the second processor is determined to be operated when the value related to the reception state is larger than a predetermined first threshold.

10. The apparatus of claim 9, wherein the first processor comprises:

a first low noise amplifier (LNA) for amplifying the inputted signal; and a first switch for selecting at least one of the first LNA and the second processor under control of the controller.

11. The apparatus of claim 10, wherein the first LNA is an LNA using a chemical compound.

12. The apparatus of claim 9, wherein the second processor comprises:

a second LNA for amplifying the inputted signal or the amplified signal by the first processor; and a second switch for selecting at least one of the second LNA and the first processor under control of the controller.

13. The apparatus of claim 12, wherein the second LNA is a complementary metal-oxide semiconductor (CMOS) LNA.

14. The apparatus of claim 9, wherein when the value related to the reception state is smaller than the first threshold, the controller determines to operate the first processor.

15. The apparatus of claim 9, wherein when the value related to the reception state is larger than a predetermined second threshold, the controller determines to operate none of the first and second processors.

16. The apparatus of claim 15, wherein when the value related to the reception state is smaller than a predetermined third threshold, the controller determines to operate both of the first and second processors.

17. The apparatus of claim 16, wherein the first threshold is smaller than the second threshold and larger than the third threshold.

\* \* \* \* \*